(12) United States Patent  
Choi et al.

(10) Patent No.: US 7,807,571 B2
(45) Date of Patent: Oct. 5, 2010

(54) SEMICONDUCTOR DEVICE AND METHODS OF FORMING THE SAME

(75) Inventors: Kyung-In Choi, ChunCheon-si (KR); Gil-Heyun Choi, Seoul (KR); Sang-Woo Lee, Seoul (KR); Jong-Myeong Lee, Seongnam-si (KR); Jong-Won Hong, Suwon-si (KR); Hyun-Bae Lee, Suwon-si (KR)

(73) Assignee: Samsung Electronics Co., Ltd., Gyeonggo-Do (KR)

( * ) Notice: Subject to any disclaimer, the term of this patent is extended or adjusted under 35 U.S.C. 154(b) by 373 days.

(21) Appl. No.: 11/892,089

(22) Filed: Aug. 20, 2007

(65) Prior Publication Data

US 2008/0054468 A1 Mar. 6, 2008

(30) Foreign Application Priority Data

Sep. 5, 2006 (KR) .................. 10-2006-0085256

(51) Int. Cl.
*H01L 21/44* (2006.01)
*H01L 23/52* (2006.01)

(52) U.S. Cl. .................. 438/677; 438/639; 257/768; 257/774; 257/E21.578; 257/E23.145

(58) Field of Classification Search .............. 438/639, 438/677, 675; 257/768, 774, E21.578, E23.145
See application file for complete search history.

(56) References Cited

U.S. PATENT DOCUMENTS

| 6,365,514 | B1 | 4/2002 | Yu et al. |
| 6,376,369 | B1 | 4/2002 | Doan |
| 6,413,864 | B1 | 7/2002 | Pyo |
| 6,602,782 | B2 * | 8/2003 | Lee et al. .................. 438/674 |
| 6,642,146 | B1 | 11/2003 | Rozbicki et al. |
| 6,903,014 | B2 | 6/2005 | Batra et al. |
| 6,953,743 | B2 | 10/2005 | Sandhu et al. |
| 6,984,891 | B2 | 1/2006 | Ahn et al. |
| 2005/0263890 | A1 | 12/2005 | Han et al. |

FOREIGN PATENT DOCUMENTS

| JP | 07-115073 | 5/1995 |
| KR | 10-2001-0048302 | 6/2001 |
| KR | 10-2001-0056446 | 7/2001 |
| KR | 1020050009352 | 1/2005 |
| KR | 10-0494648 | 6/2005 |
| KR | 1020050113300 | 12/2005 |

* cited by examiner

*Primary Examiner*—Steven J Fulk
(74) *Attorney, Agent, or Firm*—Harness, Dickey & Pierce, P.L.C.

(57) ABSTRACT

An example embodiment provides a method of forming a conductive pattern in a semiconductor device. The method includes forming one or more dielectric layers over a first conductive pattern formed on a substrate; forming an opening in the one or more dielectric layers to expose a portion of the first conductive pattern, forming a growth promoting layer over the exposed portion of the first conductive pattern and the one or more dielectric layers, forming a growth inhibiting layer over a portion of the growth promoting layer, and forming the second conductive layer in the opening.

31 Claims, 9 Drawing Sheets

SEMICONDUCTOR DEVICE AND METHODS OF FORMING THE SAME

PRIORITY STATEMENT

This application claims the priority of Korean Patent Application No. P2006-85256 filed on Sep. 5, 2006 in the Korean Intellectual Property Office, the entire contents of which are incorporated herein by reference.

BACKGROUND

1. Field of the Invention

Example embodiments relate to semiconductor devices and methods of forming semiconductor devices. More specifically, example embodiments relate to semiconductor devices including a growth promoting layer and a growth inhibiting layer, as well as methods of forming semiconductor devices including a growth promoting layer and a growth inhibiting layer.

2. Description of the Related Art

Due to increases in semiconductor packaging densities, the dimensions of electrical contacts have been reduced, thereby increasing height-to-width or aspect ratios of the electrical contacts and openings in which the electrical contacts are formed. With increasing aspect ratios, adequate metal step coverage of surfaces within the opening has become more difficult to achieve, especially at temperatures lower than about 200° C. As the aspect ratio increases, metal deposited at colder temperatures fails to produce good step coverage due to "necking" (or "cusping") at the top corners of the openings in which the electrical contacts are being formed. Necking gives rise to the formation of a void within the contact formed in the opening.

FIG. 1 illustrates an example of a void created due to necking. In particular, FIG. 1 illustrates an insulating layer 205 on a substrate 200 having an impurity doped region 203 formed therein that is exposed by an opening. A diffusion barrier layer 207 (such as TiN diffusion barrier layer) is formed in the opening and on the exposed surface of the impurity doped region 203. A conductive layer 209 is formed on the diffusion barrier layer 207 on the external surfaces as well as in the opening. As shown in FIG. 1, because of the high aspect ratio of the contact hole, a void 211 is formed in the opening because of the formation of the overhang portion 215 that blocks further deposition of the conductive layer 209 in the opening.

Voids, such as the void 211 illustrated in FIG. 1, formed within an opening during the formation of an electrical contact may lead to malfunctions. Accordingly, necking tends to lead to reliability and yield problems as a result of voids created during the formation of the electrical contact. In an attempt to address this and other problems, various techniques have been developed and employed including Chemical Vapor Deposition (CVD) of metals, aluminum reflow, etc.

SUMMARY

Example embodiments provide semiconductor devices having a growth promoting layer and a growth inhibiting layer, as well as methods of forming semiconductor devices including both a growth promoting layer and a growth inhibiting layer.

An example embodiment provides a method of forming a semiconductor device. The method includes forming at least one dielectric layer over a first conductive pattern formed on a substrate; forming an opening in the at least one dielectric layer to expose a portion of the first conductive pattern; forming a growth promoting layer over the exposed portion of the first conductive pattern and the at least one dielectric layer; forming a growth inhibiting layer over a portion of the growth promoting layer within the opening; and forming the second conductive pattern in the opening. The growth inhibiting layer is not formed over a region of the growth promoting layer formed on a lower portion of the sidewalls of the opening.

Another example embodiment of a method of forming a semiconductor device includes forming at least one dielectric layer over a first conductive pattern formed on a substrate; forming an opening in the at least one dielectric layer to expose a portion of the first conductive pattern; and differentially growing a second conductive pattern in the opening using a growth promoting layer and a growth inhibiting layer. A growth rate of the second conductive layer in a lower region of the opening where the growth inhibiting layer is not formed on the growth promoting layer is greater than a growth rate of the second conductive layer in an upper region of the opening where the growth inhibiting layer is formed on the growth promoting layer.

Another example embodiment provides a semiconductor device. The semiconductor device includes a substrate including a first conductive pattern; a dielectric layer having an opening exposing a portion of the first conductive pattern; a growth promoting layer formed over sidewalls of the opening, the first conductive pattern and a top surface of the at least one dielectric layer; a growth inhibiting layer formed over at least a portion of the growth promoting layer within the opening; and a second conductive layer filling the opening. The growth inhibiting layer is not formed over a region of the growth promoting layer formed on a lower portion of the sidewalls of the opening.

Still another example embodiment provides a semiconductor device. The semiconductor device includes a substrate including a first conductive pattern; a dielectric layer having an opening exposing a portion of the first conductive pattern; a growth promoting layer formed over sidewalls of the opening and the first conductive pattern; a growth inhibiting layer formed over at least a portion of the growth promoting layer within the opening, the growth inhibiting layer is not formed over a region of the growth promoting layer formed on a lower portion of sidewalls of the opening; and a second conductive layer filling the opening. According to this example embodiment, top surfaces of the second conductive layer and the dielectric layer are coplanar.

BRIEF DESCRIPTION OF THE DRAWINGS

The above and other aspects and advantages of example embodiments will become more apparent by describing, in detail, example embodiments with reference to the attached drawings in which.

DETAILED DESCRIPTION OF EXAMPLE EMBODIMENTS

Various example embodiments are now described more fully with reference to the accompanying drawings. However, specific structural and functional details disclosed herein are merely representative for purposes of describing example embodiments, and one skilled in the art will appreciate that example embodiments may be embodied in many alternate forms and should not be construed as limited to only the embodiments set forth herein.

It will be understood that, although the terms first, second, etc. may be used herein to describe various components, these components should not be limited by these terms. These terms are only used to distinguish one component from another. For example, a first component could be termed a second component, and, similarly, a second component could be termed a first component, without departing from the scope of the example embodiments.

It will be understood that when a component is referred to as being "connected" or "coupled" to another component, it can be directly connected or coupled to the other component or intervening components may be present. In contrast, when a component is referred to as being "directly connected" or "directly coupled" to another component, there are no intervening components present. Other words used to describe the relationship between components should be interpreted in a similar manner (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, unless the context clearly indicates otherwise.

Example embodiments are described in detail below with reference to the attached drawings. FIGS. 2-7 illustrate an example embodiment of a semiconductor device being formed according to an example method.

Figure 1:
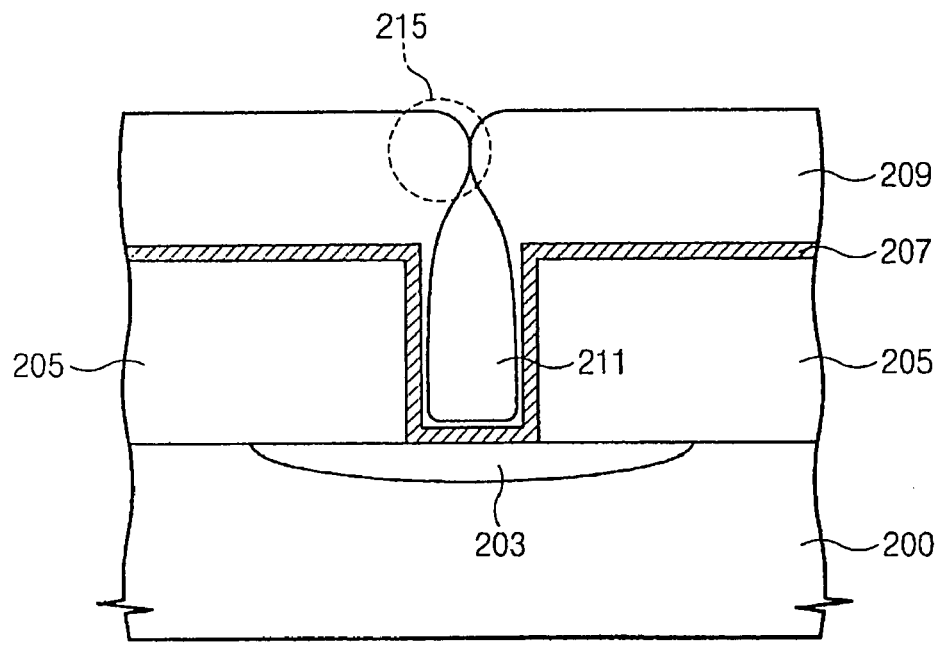
FIG. 1 illustrates an example of a void created due to necking in a conventional semiconductor device.
Figure 2:
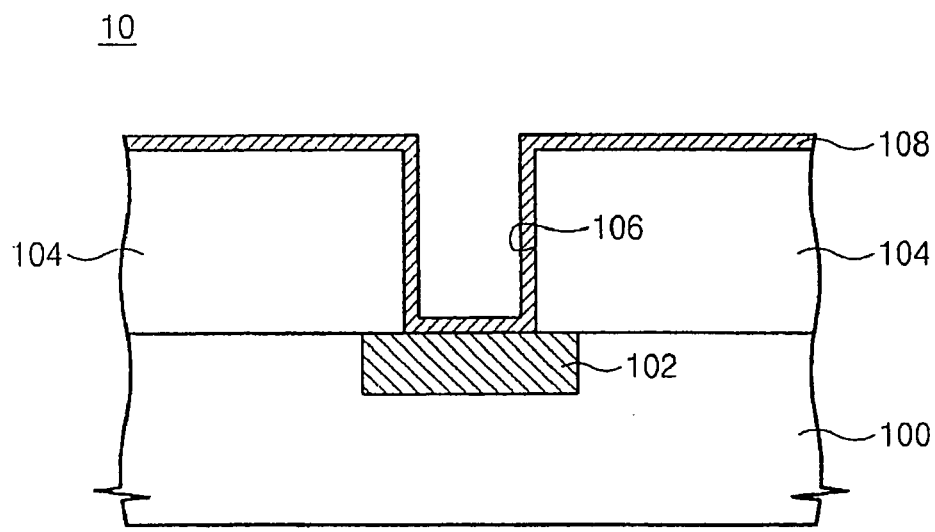
FIG. 2 illustrates an example embodiment of a semiconductor device.

Referring to FIG. 2, an example embodiment of a semiconductor device 10 includes a substrate 100 having a bottom conductive pattern 102 formed therein. According to an example embodiment, the bottom conductive pattern 102 includes tungsten W, aluminum Al, copper Cu, an impurity junction region, and/or a via pattern. The conductive pattern 102 may have a line or pad shape. A dielectric layer 104, which may include one or more layers, is formed on the substrate 100 and the bottom conductive pattern 102. For example, if the bottom conductive pattern 102 is copper Cu, the dielectric layer 104 may be a double layer, including a barrier layer and an oxide layer which are stacked. In this case, the barrier layer would include a nitride layer or an oxy-nitride layer functioning to inhibit and/or prevent the copper Cu atoms from diffusing out of the bottom conductive pattern 102. For simplicity reasons, the different layers of the dielectric layer 104 are not illustrated in FIG. 2. The specifics of the substrate 100, the bottom conductive pattern 102 and the dielectric layer 104, as well as the formation of the substrate, the bottom conductive pattern 102 and the dielectric layer 104 are well known in the art, and thus, will not be further discussed herein for the sake of brevity.

Still referring to FIG. 2, the dielectric layer 104 is then patterned to form an opening 106 exposing the bottom conductive pattern 102. The opening 106 may have a hole or line shape, for example.

Once the opening 106 is formed and an upper surface of the bottom conductive pattern 102 is exposed, an optional cleaning step may be performed on the upper surface of the bottom conductive pattern 102. For example, the upper surface of the bottom conductive pattern 102 may be cleaned using radio frequency (RF) plasma. Cleaning the surface of a conductive pattern with RF plasma is well known in the art, and thus, will not be discussed herein for the sake of brevity.

Once the opening 106 is formed, and optionally, the upper surface of the bottom conductive pattern 102 cleaned, a growth promoting layer 108 is formed on the upper surface of the dielectric layer 104 outside of the opening 106, the sidewalls of the opening 106, and the upper surface of the bottom conductive pattern 102 within the opening 106. The growth promoting layer 108 is a conductive layer and may be formed using CVD techniques or Physical Vapor Deposition (PVD) techniques. The growth promoting layer 108 includes one or more of tantalum Ta, titanium Ti, niobium Nb, vanadium V, zirconium Zr, hafnium Hf, molybdenum Mo, rhenium Re and tungsten W. Further, the growth promoting layer 108 may include a nitride of one or more of the previously-listed metals.

If the growth promoting layer 108 is formed using CVD techniques, the growth promoting layer 108 is conformably formed on the upper surface of the dielectric layer 104 outside of the opening 106, the sidewalls of the opening 106, and the upper surface of the bottom conductive pattern 102 within the opening. Stated differently, the thickness of the growth promoting layer on the different surfaces of the semiconductor device 10 is relatively uniform according to an example embodiment.

As indicated above, the growth promoting layer 108 may also be formed using PVD techniques. If the growth promoting layer 108 is formed by PVD, the thicknesses of the growth promoting layer 108 on the different surfaces are generally different. For example, the growth promoting layer 108 deposited on the top surface of the dielectric layer 104 outside of the opening 106 is thicker than the growth promoting layer 108 deposited on the sidewalls of the opening 106 and upper surface of the bottom conductive pattern 102 formed within the opening 106 when the growth promoting layer 108 is formed using PVD techniques according to an example embodiment. Further, the growth promoting layer 108 deposited on the bottom surface of the opening 106, i.e., the upper surface of the bottom conductive pattern 102, may be thicker than the growth promoting layer 108 deposited on the sidewalls of the opening 106.

To form the growth promoting layer 108 of a refractory metal by PVD, the substrate 100 having the opening 106 is loaded into a process chamber along with a target of a refractory metal such as tantalum Ta, titanium Ti, niobium Nb, vanadium V, zirconium Zr, hafnium Hf, molybdenum Mo, rhenium Re or tungsten W, for example. Then, the growth promoting layer 108 is formed on the upper surface of the dielectric layer 104 outside of the opening 106, the sidewalls of the opening 106, and the upper surface of the bottom conductive pattern 102 within the opening by colliding an inert gas atom ion such as argon Ar with the target of the refractory metal. If the growth promoting layer 108 is a metal nitride layer, such as a tantalum-nitride TaN layer, for example, a target of tantalum is inserted into the chamber and a first flow of nitrogen source gas, instead of the argon Ar gas, is applied to the process chamber to form the growth promoting layer 108.

Figure 3:
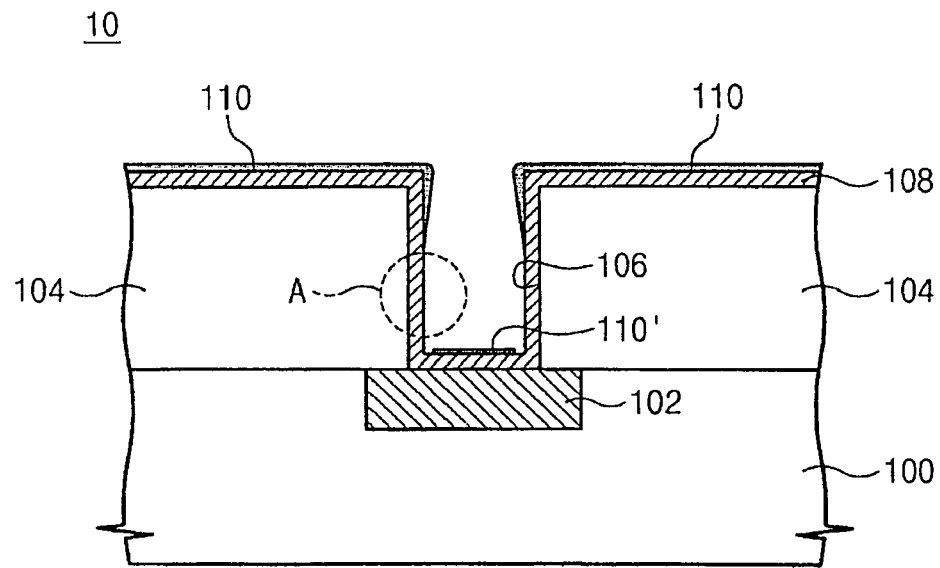
FIG. 3 illustrates an example embodiment of a semiconductor device.

Referring to FIG. 3, according to an example embodiment, a growth inhibiting layer 110 is deposited on at least a portion of the growth promoting layer 108. For example, the growth inhibiting layer 110 is deposited on the growth promoting layer 108 in regions outside of the opening 106, the upper sidewall regions of the opening 106 and the upper surface of the growth promoting layer 108 located at the bottom of the opening 106. In FIG. 3, the growth inhibiting layer 110 is not formed on the region A of the growth promoting layer 108 on the lower sidewalls of the opening 106. The growth inhibiting layer 110 is a nitride of one or more of tantalum Ta, titanium Ti, niobium Nb, vanadium V, zirconium Zr, hafnium Hf, molybdenum Mo, rhenium Re and tungsten W. The growth inhibiting layer 110 includes a higher nitrogen $N_2$ concentration than the growth promoting layer 108. As shown in FIG. 3, the growth inhibiting layer 110 is a conductive layer that is thinner than the growth promoting layer 108.

If the growth promoting layer 108 does not include nitrogen or contains substantially zero nitrogen, the growth inhibiting layer 110 is formed by providing a first amount of nitrogen source gas, such as nitrogen $N_2$ or ammonium $NH_3$, into the process chamber along with a target of a refractory metal during PVD. The resulting growth inhibiting layer 110 will then have a nitrogen concentration higher than zero. If the growth promoting layer 108 is a metal nitride of a refractory metal, during formation of the growth inhibiting layer 110 by PVD, the flow of the nitrogen source gas used during formation of the growth inhibiting layer 110 is greater that the flow of the nitrogen source used during the formation of the growth promoting layer 108.

Figure 4:
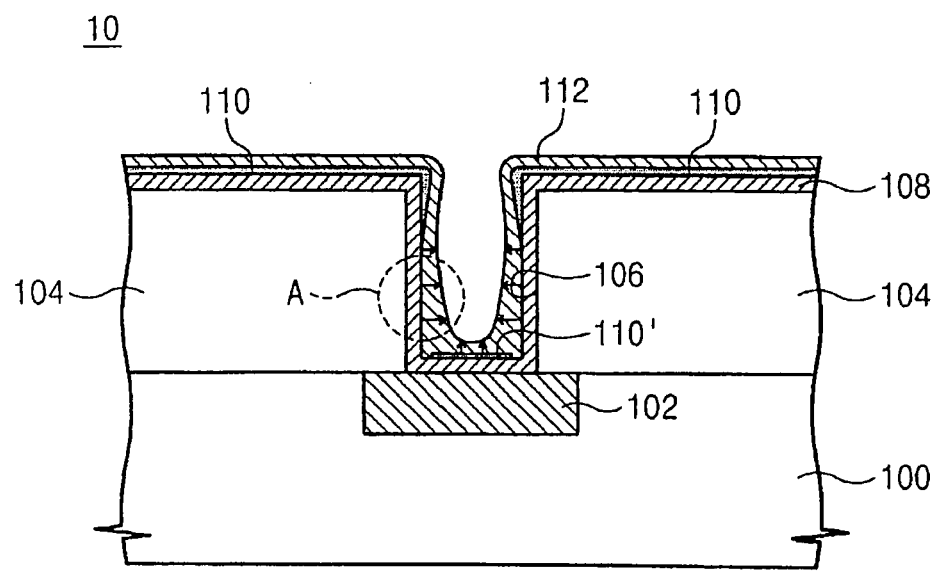
FIG. 4 illustrates an example embodiment of a semiconductor device.

Referring to FIG. 4, an aluminum Al layer 112 is then grown on the exposed surfaces of the semiconductor device 10 according to an example embodiment. Both the growth promoting layer 108 and the growth inhibiting layer 110 affect the deposition rate of the aluminum Al on the semiconductor device 10. For example, the deposition rate of aluminum Al of the exposed portion A of the growth promoting layer 108 is greater than the deposition rate of the aluminum Al on the growth inhibiting layer 110. As such, the thickness of the first aluminum Al layer 112 in region A is thicker than the thickness of the first aluminum Al layer 112 on regions outside of the opening 106 after the same time duration of PVD. The deposition rate of aluminum Al onto the growth promoting layer 108 is greater than the deposition rate of the aluminum Al onto the growth inhibiting layer 110 at least in part because the increased nitrogen $N_2$ concentration of the growth inhibiting layer 110 reduces the number of nucleation sites used to form the aluminum Al layer 112. Stated differently, the growth promoting layer 108 has a larger number of nucleation sites than the growth inhibiting layer 110 because the growth inhibiting layer 110 has a larger nitrogen concentration than the growth promoting layer 108.

Figure 5:
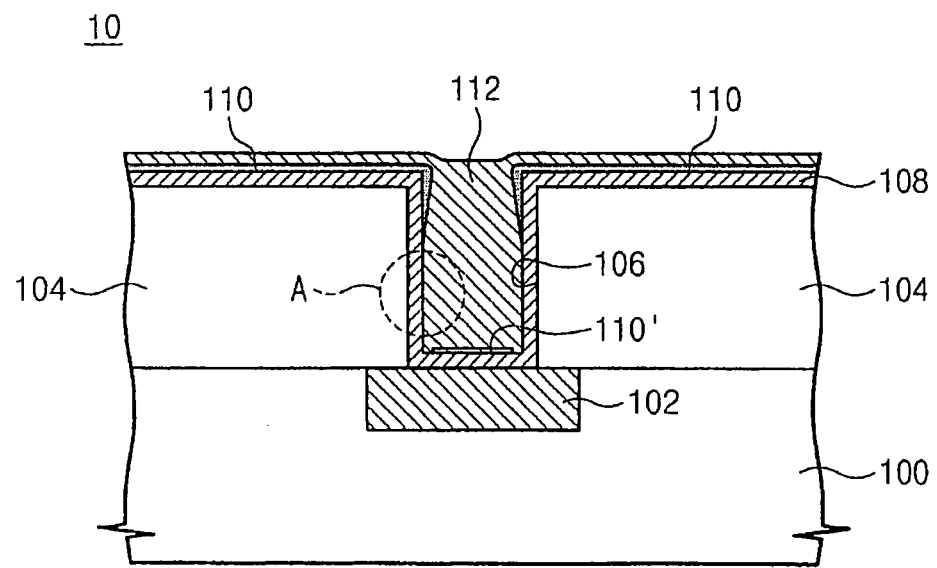
FIG. 5 illustrates an example embodiment of a semiconductor device.

Referring to FIG. 5, the first aluminum Al layer 112 is deposited into the opening 106 until the first aluminum Al layer 112 substantially fills the opening 106. Further, because the deposition rate of the aluminum Al on the growth inhibiting layer 110 is less than the deposition rate of the first aluminum Al layer 112 on the exposed regions A of the growth promoting layer 108, necking affects are reduced; thereby, the likelihood of voids being created is reduced and/or eliminated.

Figure 6:
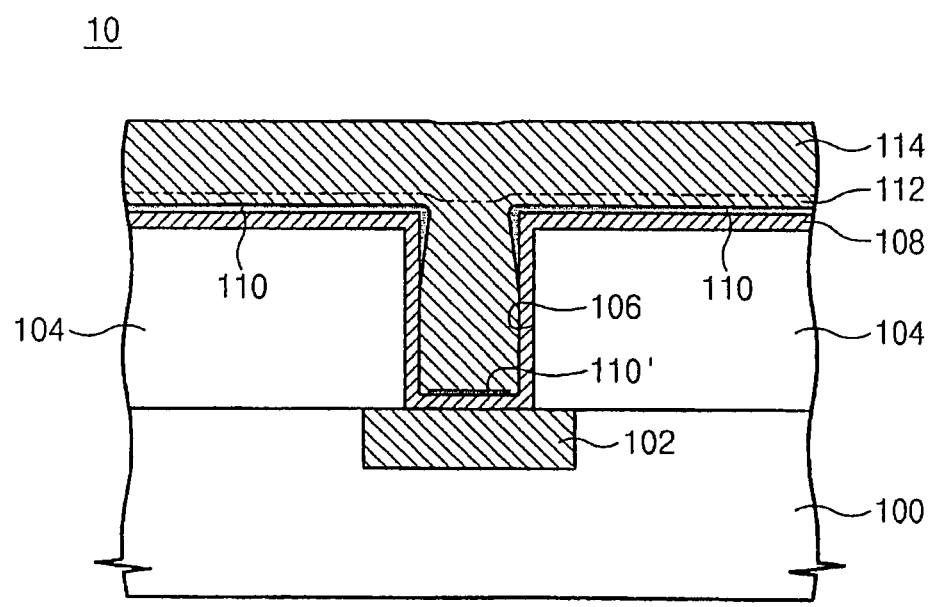
FIG. 6 illustrates an example embodiment of a semiconductor device.

Referring to FIG. 6, a second aluminum Al layer 114 is formed on the first aluminum Al layer 112. According to an example embodiment, the second aluminum Al layer 114 is formed using PVD techniques in order to increase throughput. Further, the aluminum Al layer 114 may be formed by PVD at a low temperature, followed by a reflow step. Alternatively, the aluminum Al layer 114 may be formed by PVD at a relatively high temperature without a following reflow step.

Figure 7:
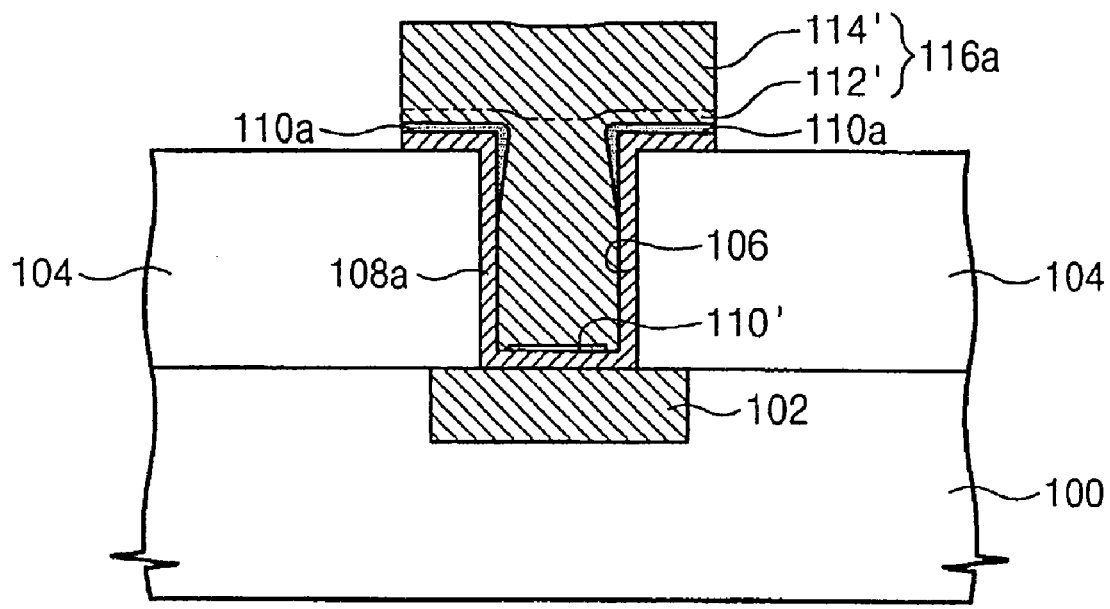
FIG. 7 illustrates an example embodiment of a semiconductor device.

Referring to FIG. 7, the first and second aluminum Al layers 112 and 114, the growth inhibiting layer 110 and the growth promoting layer 108 are sequentially patterned. In particular, the first and second aluminum Al layers 112 and 114 are patterned to form a metal pattern 116A including the first metal line pattern 112' and the second metal line pattern 114'. Still referring to FIG. 7, the growth inhibiting layer 110 and the growth promoting layer 108 are patterned to produce the growth promoting pattern 108A and the growth inhibiting pattern 110A.

Figure 8:
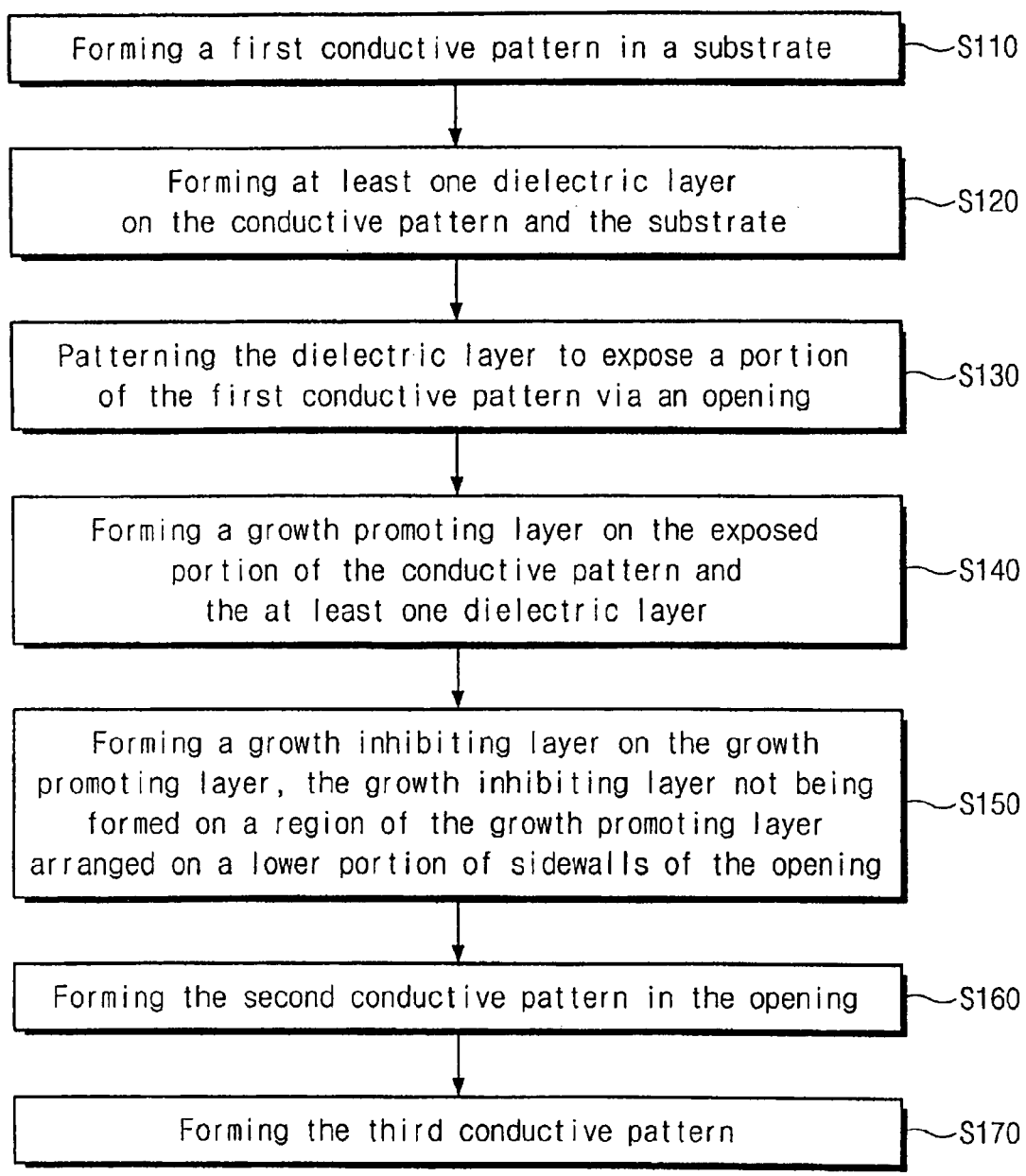
FIG. 8 is a flow chart illustrating an example embodiment of a method forming the semiconductor device illustrated in FIGS. 2-7.

FIG. 8 is a flow chart illustrating an example embodiment of a method forming the semiconductor device 10 illustrated in FIGS. 2-7.

Referring to FIG. 8, a first conductive pattern is formed in a substrate 100 in step S110. As previously described with reference to FIG. 2, the first conductive pattern may be the bottom conductive pattern 102, which may include tungsten W, aluminum Al, copper Cu, an impurity junction region, and/or a via pattern, and has a line or pad shape, for example.

Then, one or more dielectric layers 104 are formed on the substrate 100 and first conductive pattern 102 in step S120. The one or more dielectric layers 104 may include one or more barrier layers. As indicated above with respect to FIG. 2, if the bottom conductive pattern 102 is copper Cu, the dielectric layers 104 likely include a barrier layer functioning to inhibit and/or prevent the copper Cu atoms from diffusing out of the bottom conductive pattern 102.

In step S130, the one or more dielectric layers 104 are patterned to expose a portion of the first conductive pattern 102 via the opening 106. The opening 106 may have a hole or line shape. Further, the opening 106 may expose all or only a portion of the conductive pattern 102.

In step S140, a growth promoting layer 108 is formed on the exposed portion of the first conductive pattern 102 and the exposed portions of the one or more dielectric layers 104. As previously indicated, the growth promoting layer 108 includes one or more of tantalum Ta, titanium Ti, niobium Nb, vanadium V, zirconium Zr, hafnium Hf, molybdenum Mo, rhenium Re and tungsten W. Further, the growth promoting layer 108 may be a nitride of one or more of the listed metals.

In step S150, a growth inhibiting layer 110 is formed on at least a portion of the growth promoting layer 108 within the opening 106 in step S150. For example, the growth inhibiting layer 110 may be formed on the growth promoting layer 108 in regions corresponding to the bottom of the opening 106, upper sidewalls of the opening 106 and regions external to the opening 106. The growth inhibiting layer 110 is a nitride of one or more of tantalum Ta, titanium Ti, niobium Nb, vanadium V, zirconium Zr, hafnium Hf, molybdenum Mo, rhenium Re and tungsten W. The growth inhibiting layer 110 is not formed on a region of the growth promoting layer 108 arranged on the lower sidewalls of the opening 106. The growth inhibiting layer 110 includes a higher nitrogen $N_2$ concentration than the growth promoting layer 108.

In step S160, a second conductive layer is formed to at least partially fill the opening 106. The deposition rate of the second conductive layer is affected by the growth promoting layer 108 and the growth inhibiting layer 110 as previously discussed with respect to FIG. 4. In FIG. 4, the second conductive layer corresponds to the first aluminum layer 112 illustrated in FIG. 4. Accordingly, the growth rate of the second conductive layer in a lower region of the opening 106 where the growth inhibiting layer 110 is not formed on the growth promoting layer 108 is greater than a growth rate of the second conductive layer in an upper region of the opening 106 where the growth inhibiting layer 110 is formed on the growth promoting layer 108.

A third conductive pattern is then formed to provide an electrical contact to the second conductive pattern in step S170. In the example illustrated in FIG. 7, the third conducive pattern is the line type metal pattern 116a.

Figure 9:
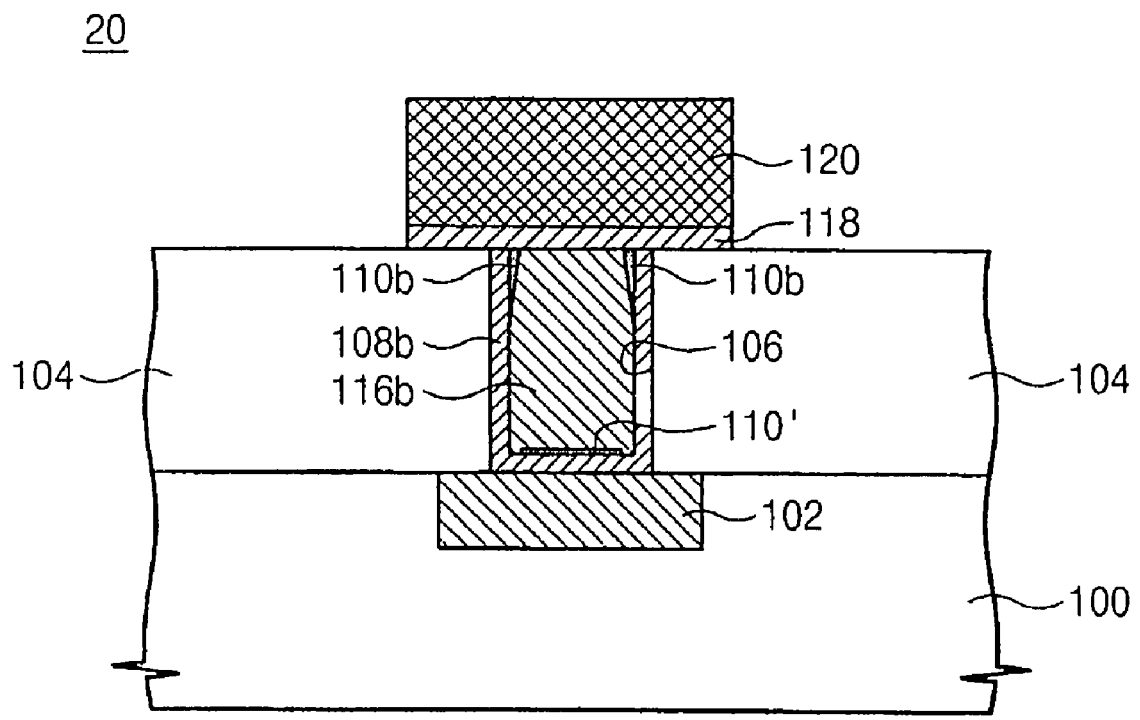
FIG. 9 illustrates another example embodiment of a semiconductor device.

FIG. 9 illustrates another example embodiment of a semiconductor device. The semiconductor device 20 shown in FIG. 9 is also formed using method steps S110-S150 described with respect to FIG. 8.

As shown in FIG. 9, once the second conductive layer, i.e., the first aluminum Al layer 112, is formed to fill the opening 106, the first aluminum layer 112, the growth inhibiting layer 110 and the growth promoting layer 108 are planarized. For example, the first aluminum Al layer 112, the growth inhibiting layer 110 and the growth promoting layer 108 may be planarized by Chemical Mechanical Polishing (CMP) to expose a top surface of the dielectric layer 104. Then, an interconnection line pattern 120 may be formed on the dielectric layer 104, the first aluminum Al pattern 116b, the growth promoting pattern 108b and the growth inhibiting pattern 110b. The interconnection line pattern 120 may include aluminum and/or copper. A wetting layer 118 may be formed under the interconnection line pattern 120. In other words, the wetting layer 118 and the interconnection line pattern 120 may be sequentially stacked on the first aluminum Al pattern 116b, the growth promoting pattern 108b and the growth inhibition pattern 110b. The wetting layer 118 may include at least one of a refractory metal and a metal nitride. For example, the wetting layer 118 may include Ti, Ta, TiN, TaN, Ti/TiN or Ta/TaN.

Figure 10:
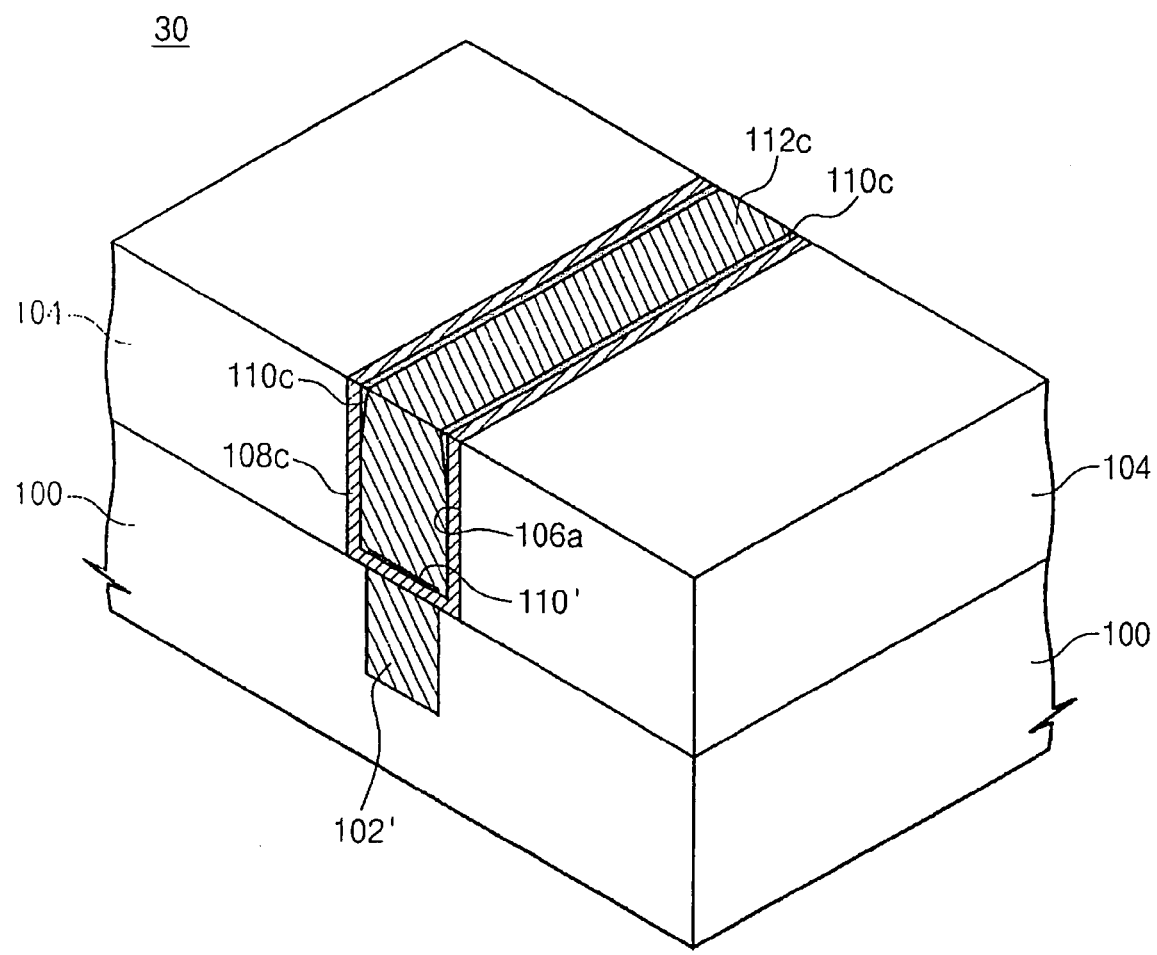
FIG. 10 illustrates still another example embodiment of a semiconductor device.

FIG. 10 illustrates yet another example embodiment of a semiconductor device. The semiconductor device 30 shown in FIG. 10 includes both a growth promoting pattern 108c and a growth inhibiting pattern 110c. Referring to FIG. 10, the opening 106 formed in step S130 of FIG. 8 is a groove shaped opening. Thus, the second conductive layer, i.e., the first aluminum Al layer 112, is patterned into a conductive line 112c.

In support of the above description of example embodiments, the following table of experimental data is provided.

|  | First wafer | Second wafer | Third wafer |
| --- | --- | --- | --- |
| Al thickness (Å) | 1015 Å | 670 Å | 220 Å |

To obtain the experimental data shown above, three wafers were prepared. The first wafer having a tantalum Ta layer with a thickness of 300 Å formed thereon was placed in a process chamber along with an aluminum Al precursor used to form an aluminum Al layer on the tantalum Ta layer. After performing the CVD with the aluminum Al precursor for 60 seconds, the thickness of the aluminum Al on the first wafer was 1,015 Å.

A second wafer was prepared having a tantalum nitride layer TaN. In particular, the tantalum-nitride TaN layer was formed by inserting a wafer into a process chamber along with a target of tantalum Ta and injecting a nitrogen source gas into the process chamber at a flow rate of 15 sccm until the PVD process provided a tantalum-nitride TaN layer of 300 Å onto the wafer. The second wafer including the tantalum nitride TaN layer was then placed in a process chamber along with an aluminum Al precursor used to form an aluminum Al layer on the tantalum nitride TaN layer. After performing the CVD with the aluminum precursor for 60 seconds, the thickness of the aluminum Al on the tantalum nitride TaN layer was 670 Å.

To prepare the third wafer, a wafer was inserted into a process chamber along with a target of tantalum Ta, and a nitrogen source gas was injected into a chamber with a flow rate of 35 sccm to form a tantalum-nitride TaN layer having a thickness of 300 Å on the third wafer. Because the flow rate of the nitrogen source gas used to prepare the third wafer was greater than the flow rate of the nitrogen source gas used to prepare the second wafer, the tantalum nitride TaN layer formed on the third wafer had a higher concentration of nitrogen $N_2$ than the tantalum nitride TaN layer formed on the second layer. Next, a CVD process was performed on the third wafer having the tantalum-nitride TaN layer. In particular, an aluminum Al precursor was injected into the process chamber and an aluminum Al layer was formed on the tantalum-nitride TaN layer for 60 seconds. The thickness of aluminum Al layer after 60 seconds was 220 Å.

A comparison of the aluminum Al layer formed on the first through third wafers indicates that as the concentration of nitrogen $N_2$ in the layer on which the aluminum Al layer is formed increases, the deposition rate of aluminum Al decreases.

Figure 11:
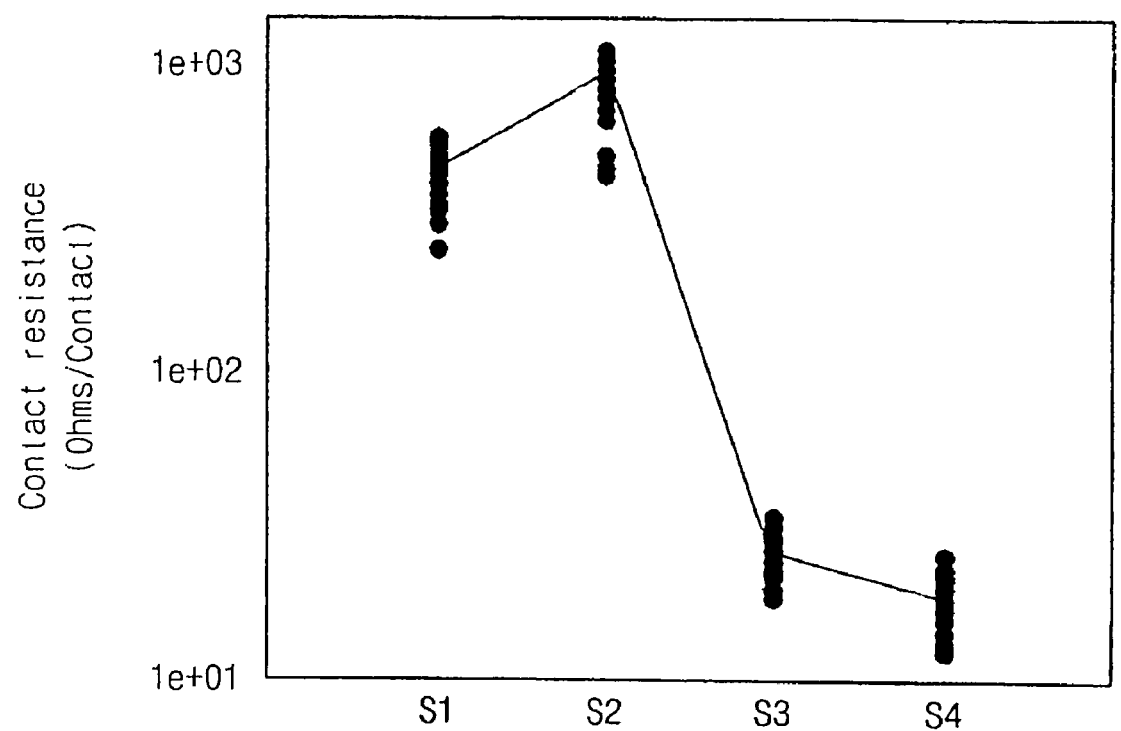
FIG. 11 is a graph illustrating the contact resistance of contacts formed according to conventional methods and example embodiments.

FIG. 11 is a graph illustrating the contact resistance of contacts formed according to conventional methods and example embodiments. In FIG. 11, the vertical axis shows the contact resistance in ohms/contact. The horizontal axis identifies four different samples S1-S4.

Samples S1 and S2 represent sample electrical contacts formed according to conventional methods and samples S3 and S4 represent electrical contact plugs formed according to example embodiments. In particular, sample S1 is an electrical contact of aluminum Al formed on a tantalum Ta layer covering the sidewalls and bottom of the opening. The tantalum Ta layer on which the electrical contact was formed had a thickness of 300 Å. The second sample S2 represents an aluminum Al electrical contact formed on a tantalum-nitride TaN layer covering the sidewalls and bottom of the opening.

Sample S3 represents an electrical contact formed on a growth promoting layer 108 and a growth inhibiting layer 110 within an opening according to an example embodiment. The growth promoting layer 108 in sample S3 was a tantalum Ta layer having a thickness of 300 Å, and the growth inhibiting layer 110 in sample S3 is a tantalum nitride TaN layer having a thickness of 150 Å.

Sample S4 represents an electrical contact formed on a growth promoting layer 108 and a growth inhibiting layer 110 within an opening according to another example embodiment. The growth promoting layer 108 in sample S4 was a tantalum nitride TaN layer having a thickness of 300 Å and formed by PVD with the nitrogen source gas being injected into the process chamber at a flow rate of 15 sccm. The growth inhibiting layer 110 in sample S4 was a tantalum nitride TaN layer having a thickness of 100 Å and formed by PVD with the nitrogen source gas being injected in the process chamber at a flow rate of 35 sccm.

A review of FIG. 11 indicates that the contact resistances of electrical contacts formed using a conventional method, i.e., samples S1 and S2, are significantly higher than the contact resistances of electrical contacts formed according to an example embodiment, i.e., samples S3 and S4. In particular, the contact resistance of sample S1 is about 20 times higher than the contact resistance of sample S3 and is about 25 times higher the contact resistance of sample S4. Further, the contact resistance of sample S3 is about 36 times higher than the contact resistance of sample S3 and is about 45 times higher the contact resistance of sample S4. The contact resistances of samples S1 and S2 may be significantly higher than samples S3 and S4 because of the generation of voids, which may be created using conventional methods.

Figure 12:
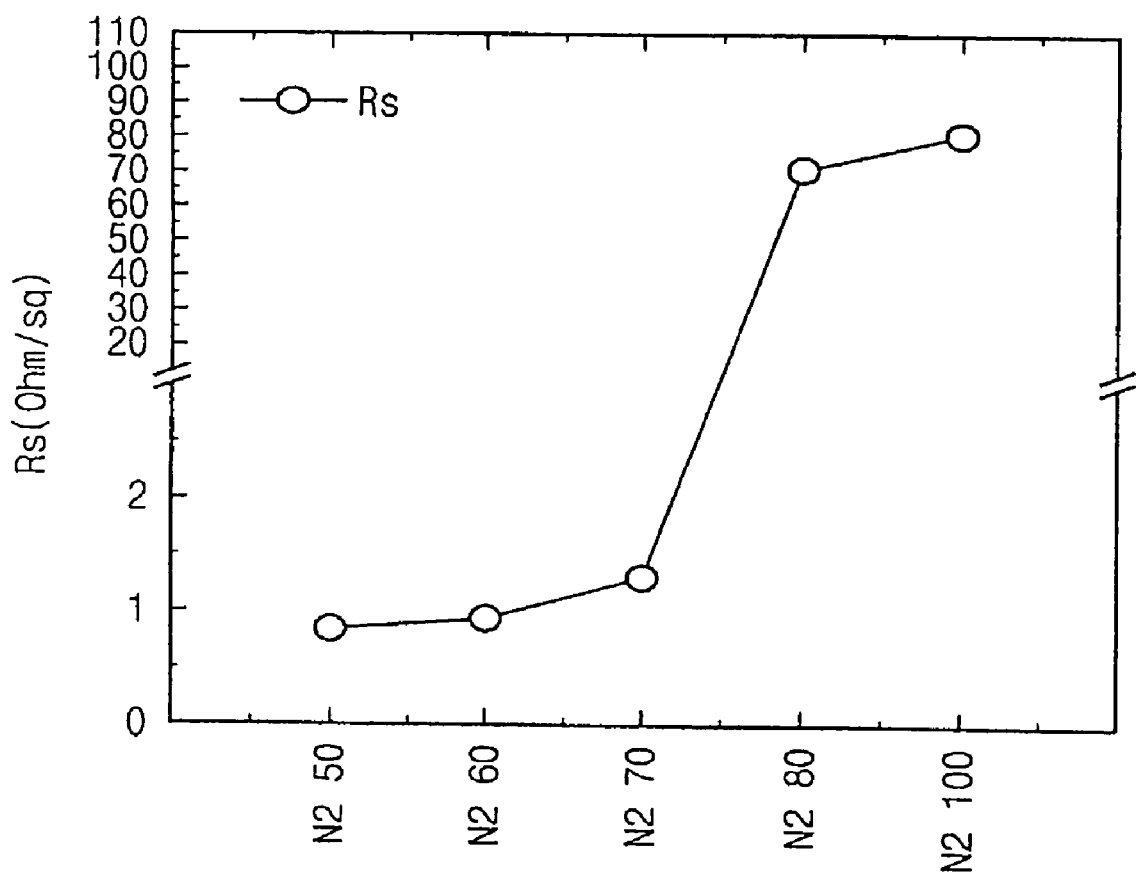
FIG. 12 is a graph illustrating the sheet resistance of contacts formed according example embodiments.

FIG. 12 is a graph illustrating the sheet resistance of contacts formed according to an example embodiment. In FIG. 12, the vertical axis shows sheet resistance in ohms/square. The horizontal axis identifies five different samples identified as N2 50, N2 60, N2 70, N2 80 and N2 100. In particular, the samples identified on the horizontal axis are samples of aluminum contacts formed on a growth promoting layer of titanium Ti and a growth inhibiting layer of titanium-nitride TiN.

For example, sample N2 50 represents an aluminum Al contact formed on a growth promoting layer of titanium Ti and a growth inhibiting layer of titanium-nitride TiN prepared with a nitrogen source gas being injected into the process chamber with a flow rate of 50 sccm. Similarly, the sample N2 100 represents an aluminum Al contact formed on a growth promoting layer of titanium Ti and a growth inhibiting layer of titanium-nitride TiN prepared with a nitrogen source gas being injected into the process chamber with a flow rate of 100 sccm. As such, the nitrogen $N_2$ concentration of the growth inhibiting layer of the sample N2 100 is higher than the nitrogen $N_2$ concentration of the growth inhibiting layer of the sample N2 50 since a higher flow rate of the nitrogen source gas is used to prepare the sample N2 100.

Accordingly, FIG. 12 illustrates that according to an example embodiment, as the nitrogen $N_2$ amount of the growth inhibiting layer increases the sheet resistance of the aluminum contacts increases. Further, as described in, previous example embodiments, as the nitrogen $N_2$ amount of the growth inhibiting layer increases the deposition rate of aluminum Al on the growth inhibiting layer decreases. As such, as the nitrogen $N_2$ amount of the growth inhibiting layer increases, the deposition rate of aluminum Al on the growth inhibiting layer decreases, and the sheet resistance of the aluminum Al contact formed on the growth inhibiting layer increases.

While this invention has been particularly shown and described with reference to example embodiments of the present invention, it will be understood by those skilled in the art that various changes in form and details may be made therein without departing from the spirit and scope of the invention as defined by the appended claims.

What is claimed is:

1. A method of forming a semiconductor device comprising:
    forming at least one dielectric layer over a first conductive pattern formed on a substrate;
    forming an opening in the at least one dielectric layer to expose a portion of the first conductive pattern;
    forming a growth promoting layer over the exposed portion of the first conductive pattern and the at least one dielectric layer;
    forming a growth inhibiting layer over a portion of the growth promoting layer within the opening, the growth inhibiting layer is not formed over a region of the growth promoting layer formed on a lower portion of sidewalls of the opening, the growth inhibiting layer and the growth promoting layer including a refractory metal; and
    forming a second conductive layer in the opening.

2. The method of claim 1, wherein the growth inhibiting layer is formed over a region of the growth promoting layer formed on an upper portion of the sidewalls of the opening.

3. The method of claim 1, wherein the growth inhibiting layer is formed over a region of the growth promoting layer outside the opening.

4. The method of claim 1, wherein the growth inhibiting layer is formed over a region of the growth promoting layer formed on a bottom surface of the opening.

5. The method of claim 1, further comprising:
    cleaning the exposed portion of the first conductive pattern prior to the forming of the growth promoting layer.

6. The method of claim 5, wherein the cleaning is performed with one of radio frequency plasma and hydrogen reduction.

7. The method of claim 1, wherein the growth promoting layer and the growth inhibiting layer are formed by one of chemical vapor disposition (CVD) and physical vapor disposition (PVD).

8. The method of claim 7, wherein the growth inhibiting layer is formed by PVD.

9. The method of claim 1, wherein the growth inhibiting layer further includes nitrogen.

10. The method of claim 1, wherein the refractory metal is one of tantalum, niobium, vanadium, zirconium, hafnium, molybdenum, rhenium, tungsten and titanium.

11. The method of claim 1, wherein both of growth promoting layer and the growth inhibiting layer include a same refractory metal.

12. The method of claim 1, wherein a nitrogen content of the growth inhibiting layer is higher than a nitrogen content of the growth promoting layer.

13. A method of forming a semiconductor device comprising:
    forming at least one dielectric layer over a first conductive pattern formed on a substrate;
    forming an opening in the at least one dielectric layer to expose a portion of the first conductive pattern; and
    differentially growing a second conductive layer in the opening using a growth promoting layer and a growth inhibiting layer, a growth rate of the second conductive layer in a lower region of the opening where the growth inhibiting layer is not formed on the growth promoting layer is greater than a growth rate of the second conductive layer in an upper region of the opening where the growth inhibiting layer is formed on the growth promoting layer, the growth inhibiting layer and the growth promoting layer including a refractory metal.

14. A semiconductor device, comprising:
a substrate including a first conductive pattern;
a dielectric layer having an opening exposing a portion of the first conductive pattern;
a growth promoting layer formed over sidewalls of the opening, the first conductive pattern and a top surface of the dielectric layer;
a growth inhibiting layer formed over at least a portion of the growth promoting layer within the opening, the growth inhibiting layer is not formed over a region of the growth promoting layer formed on a lower portion of sidewalls of the opening, the growth promoting layer and the growth inhibiting layer include a refractory metal; and
a second conductive layer filling the opening.

15. The semiconductor device of claim 14, wherein the growth inhibiting layer is formed over a region of the growth promoting layer formed on an upper portion of the sidewalls of the opening.

16. The semiconductor device of claim 14, wherein the growth inhibiting layer is formed over a region of the growth promoting layer outside of the opening.

17. The semiconductor device of claim 14, wherein the growth inhibiting layer is formed over a region of the growth promoting layer formed on a bottom surface of the opening.

18. The semiconductor device of claim 14, wherein the first conductive pattern is one of tungsten, aluminum, silicon and copper.

19. The semiconductor device of claim 14, wherein the dielectric layer includes a barrier layer and an oxide layer.

20. The semiconductor device of claim 14, wherein the growth promoting layer is a conductive layer.

21. The semiconductor device of claim 14, wherein the growth inhibiting layer further includes nitrogen.

22. The semiconductor device of claim 14, wherein the refractory metal is one of tantalum, niobium, vanadium, zirconium, hafnium, molybdenum, rhenium, tungsten and titanium.

23. The semiconductor device of claim 14, wherein both of growth promoting layer and the growth inhibiting layer include a same refractory metal.

24. The semiconductor device of claim 14, wherein a nitrogen content of the growth inhibiting layer is higher than a nitrogen content of the growth promoting layer.

25. The semiconductor device of claim 14, wherein the second conductive layer includes aluminum.

26. A semiconductor device, comprising:
a substrate including a first conductive pattern;
a dielectric layer having an opening exposing a portion of the first conductive pattern;
a growth promoting layer formed over sidewalls of the opening and the first conductive pattern;
a growth inhibiting layer formed over at least a portion of the growth promoting layer within the opening, the growth inhibiting layer is not formed over a region of the growth promoting layer formed on a lower portion of the sidewalls of the opening, the growth promoting layer and the growth inhibiting layer including a refractory metal; and
a second conductive layer filling the opening,
wherein top surfaces of the second conductive layer and the dielectric layer are coplanar.

27. The semiconductor device of claim 26, wherein the growth inhibiting layer is formed over a region of the growth promoting layer formed on an upper portion of the sidewalls of the opening.

28. The semiconductor device of claim 26, wherein the growth inhibiting layer is formed over a region of the growth promoting layer formed on a bottom surface of the opening.

29. The semiconductor device of claim 26, wherein the growth inhibiting layer further includes nitrogen.

30. The semiconductor device of claim 26, wherein a nitrogen content of the growth inhibiting layer is higher than a nitrogen content of the growth promoting layer.

31. The semiconductor device of claim 26, further comprising:
a wetting layer on the second conductive layer, the growth inhibiting layer, the growth promoting layer and the dielectric layer; and
an interconnection pattern on the wetting layer.

* * * * *